United States Patent [19]

Butt

[11] Patent Number: 4,736,236

[45] Date of Patent: Apr. 5, 1988

[54] TAPE BONDING MATERIAL AND STRUCTURE FOR ELECTRONIC CIRCUIT FABRICATION

[75] Inventor: Sheldon H. Butt, Godfrey, Ill.

[73] Assignee: Olin Corporation, New Haven, Conn.

[21] Appl. No.: 889,564

[22] Filed: Jul. 25, 1986

Related U.S. Application Data

[63] Continuation of Ser. No. 587,433, Mar. 8, 1984, abandoned.

[51] Int. Cl.[4] .......................................... H01L 23/48
[52] U.S. Cl. ...................................... 357/70; 357/68; 357/69; 357/71
[58] Field of Search ................. 357/69, 70, 71, 81, 357/68

[56] References Cited

U.S. PATENT DOCUMENTS

| | | | |
|---|---|---|---|
| 3,381,364 | 5/1968 | Winter | 288/172 |
| 3,544,857 | 12/1970 | Byrne | 357/70 |
| 3,586,301 | 3/1971 | Shibata | 29/471 |
| 3,633,076 | 1/1972 | Arndt et al. | 357/71 |
| 3,676,292 | 7/1972 | Pryor et al. | 428/433 |
| 3,726,987 | 4/1973 | Pryor et al. | 174/50 |
| 3,728,177 | 4/1973 | Caule | 156/3 |
| 3,781,596 | 12/1973 | Galli et al. | 361/398 |
| 3,868,724 | 2/1975 | Perrino | 357/65 |
| 4,138,691 | 2/1979 | Bonkohara et al. | 357/70 |
| 4,149,910 | 4/1979 | Popplewell | 148/6 |
| 4,188,636 | 2/1980 | Sato et al. | 357/71 |
| 4,312,926 | 1/1982 | Burns | 357/68 |
| 4,330,599 | 5/1982 | Winter et al. | 428/675 |
| 4,330,790 | 5/1982 | Burns | 357/70 |
| 4,362,262 | 12/1982 | Winter et al. | 228/117 |
| 4,404,264 | 9/1983 | Tatum et al. | 428/573 |
| 4,410,927 | 10/1983 | Butt | 361/386 |
| 4,429,022 | 1/1984 | Breedis et al. | 428/675 |
| 4,442,450 | 4/1984 | Lipschultz et al. | 357/81 |
| 4,461,924 | 7/1984 | Butt | 174/52 FP |
| 4,463,059 | 7/1984 | Bhattacharya et al. | 428/620 |
| 4,466,183 | 8/1984 | Burns | 357/69 |
| 4,479,140 | 10/1984 | Horvath | 357/81 |
| 4,480,262 | 10/1984 | Butt | 357/74 |
| 4,491,622 | 1/1985 | Butt | 428/632 |
| 4,498,121 | 2/1985 | Breedis et al. | 361/401 |
| 4,500,028 | 2/1985 | Breedis et al. | 228/117 |
| 4,500,605 | 2/1985 | Fister et al. | 428/469 |
| 4,513,355 | 4/1985 | Schroeder et al. | 361/403 |

(List continued on next page.)

FOREIGN PATENT DOCUMENTS

| | | |
|---|---|---|
| 0061863 | 10/1982 | European Pat. Off. |
| 2352357 | 5/1974 | Fed. Rep. of Germany |
| 2546443 | 4/1977 | Fed. Rep. of Germany |
| 2725260 | 12/1978 | Fed. Rep. of Germany |
| 2375721 | 12/1977 | France |
| 58-44759 | 3/1983 | Japan |

OTHER PUBLICATIONS

"Chip-Carriers, Pin Grid Arrays Change The PC-Board Landscape", by Jerry Lyman, *Electronics*, Dec. 29, 1981, pp. 65–75.

J. Gow III, *Semiconductor Device Package*, IBM Disclosure Bulletin, vol. 5, No. 12, p. 10, (May 1963).

*Primary Examiner*—Martin H. Edlow
*Assistant Examiner*—Mark Prenty
*Attorney, Agent, or Firm*—Gregory S. Rosenblatt; Paul Weinstein

[57] ABSTRACT

An electronic circuit assembly is disclosed including a semiconductor die having an aluminum therminal pad on its top surface. A lead frame is disposed adjacent the semiconductor die and is adapted to be electrically connected to the die. An electrical connection device interconnects the terminal pad to the lead frame. The electrical connection device includes a biclad transport tape comprising a first member formed from a nickel containing material and a second member formed from a copper containing material. The transport tape is disposed in the electronic circuit assembly with its first member bonded to the terminal pad and its second member bonded to the lead frame. The transport tape may be constructed so as to efficiently dissipate heat from the semiconductor die.

17 Claims, 3 Drawing Sheets

U.S. PATENT DOCUMENTS

| | | | |
|---|---|---|---|
| 4,521,469 | 6/1985 | Butt et al. | 428/35 |
| 4,524,238 | 6/1985 | Butt | 174/52 FP |
| 4,525,422 | 6/1985 | Butt et al. | 428/418 |
| 4,532,222 | 7/1985 | Butt | 501/32 |
| 4,542,259 | 9/1985 | Butt | 174/52 FP |
| 4,569,692 | 2/1986 | Butt | 75/235 |
| 4,570,337 | 2/1986 | Butt | 29/840 |
| 4,577,056 | 3/1986 | Butt | 174/52 FP |
| 4,594,770 | 6/1986 | Butt | 29/588 |
| 4,607,276 | 8/1986 | Butt | 357/79 |
| 4,625,400 | 12/1986 | Fister | 29/879 |
| 4,649,083 | 3/1987 | Fister et al. | 428/469 |
| 4,656,499 | 4/1987 | Butt | 357/74 |
| 4,659,404 | 4/1987 | Butt | 156/62 |

TAPE BONDING MATERIAL AND STRUCTURE FOR ELECTRONIC CIRCUIT FABRICATION

This application is a continuation of U.S. patent application Ser. No. 587,433, filed Mar. 8, 1984 and now abandoned, by Sheldon H. Butt, for TAPE BONDING MATERIAL STRUCTURE FOR ELECTRONIC CIRCUIT FABRICATION.

The present invention relates to U.S. patent application Ser. No. 587,411, entitled "Tape Packages" by Sheldon H. Butt, filed Mar. 8, 1984 and now U.S. Pat. No. 4,607,276.

While the invention is subject to a wide range of applications, it is especially suited for electrically connecting integrated circuits to lead frames and will be particularly described in that connection.

Tape Automated Bonding (TAB), an alternative to wire bonding, is a technique of interconnecting bonding pads on a semiconductor device with a lead frame or the equivalent lead pattern in Leadless Ceramic Chip Carriers (LCCC).

In Tape Automatic Bonding, a lead pattern is etched from a relatively thin metal foil or tape into a desired configuration. The tips of the metal fingers are bonded to the bonding pads on a semiconductor die. The other end of the fingers are bonded to the leads on a lead frame. Upon completion of the bonding step, any remaining metal is removed. The result is a multiplicity of substantially rectangular wires connecting the die to the lead frame.

U.S. Pat. No. 4,330,790 to Burns discloses a typical TAB package. Also, a description of new technology with respect to chip carriers and TAB is presented in an article entitled "Chip-Carriers, Pin Grid Arrays Change The PC-Board Landscape" by Jerry Lyman, *Electronics*, Dec. 29, 1981, Pages 65-75.

Tape Automated Bonding has two particular advantages. Firstly, all of the bonds between the tape and the lead frame and between the tape and the bonding pads on the die are fabricated in a single operation rather than the multiple operations required in wire bonding individually wires.

Secondly, the tape is produced from very thin foil, commonly having a thickness from between about 0.0014 to about 0.0042". This permits the formation of very narrow internal tips of the TAB leads. They may be constructed to be narrower than the flattened ball formed in the ball bonding operation for wire bonding. This allows the possibility of using narrower bonding pads around the periphery of the die than possible where ball bonding is used. This is extremely advantageous in the case of semiconductor devices which require a relatively large number of interconnections such as a complex microprocessor which may require over a hundred and fifty of such interconnections.

The tape may be a single layer of etched foil, such as copper. Other possibilities include two or three layer tape. The layer tape is constructed of a layer of plastic film applied to one or both sides of the etched foil to provide features such as added support or a handling mechanism. This film may be a polyimide film of about 1 to 2 mils in thickness. With layer tape, portions of the plastic film are removed before lamination to the etched tape in order to leave the metal exposed for bonding.

In a conventional semiconductor die, the bonding pads around the periphery of the die are essentially flush with the top surface of the die. For processing considerations, they do not extend out quite to the edge of the die. If flat tape is bonded directly to the flush bonding pads on the die, the tape may contact the outer periphery of the die as well as the pad and cause a short circuit. This potential problem can be dealt with in two ways. The most conventional method is to bump the bonding pad on the die by raising its surface somewhat above the general surface level of the die. This acts to raise the tape safely above the edge of the die. An alternative which is now becoming popular is to bump the tape and use a flat die without a raised pad.

Commonly, one or two ounce thickness copper foil (0.0014" or 0.0028") is used on flat TAB foil while two or three ounce copper foil is used on bumped or B-TAB foil. The extra thickness in the B-TAB foil is required to leave metal from which the bump is fabricated while etching away the material in the remainder of the foil.

When TAB or B-TAB are used in a plastic encapsulated device, the next step following tape bonding and removal of surplus material is to encapsulate the device in plastic. Commonly, this is performed by placing the preassembled lead frame, tape and semiconductor die in a molding and transfer mold an epoxy around the die tape and lead frame. The plastic or epoxy, a relatively viscous material, flows laterally into the mold and subjects the bond between the tape and the die, as well as the lead frame and the tape itself to substantial shear forces. These shear forces are strong enough to break the bond or deform the finger elements between the die and the lead frame. A short circuit may result if the adjacent fingers come into contact with each other or are sufficiently close so as to permit flow of current between the two adjacent fingers. The fingers could also be deformed enough to contact the edge of the die despite the bump and thereby cause a short circuit.

These factors impose some design limitations upon the use of the TAB. Everything else being equal, the longer the span between the die and the lead frame which the tape must bridge, the greater the shear forces which must be dealt with in encapsulation. Increased shear forces increase the stress on the bonds and also increase the stress tending to deform the fingers. The stress on the bonds may be reduced by decreasing the cross section of the fingers. However, this may have a negative result because the fingers become easier to permanently deform. If the cross section of the fingers is increased in order to increase their resistance to deformation, the stress on the bonds also increase.

A higher strength material is of potential advantage since, for equal resistance to finger deformation, it would permit the use of a finger of smaller dimensions. Alternatively, it would permit a longer span between the bonding pad and the lead frame. The longer span could have a smaller cross section than would otherwise be required to avoid finger deformation. Such a cross section would enable the shear forces upon the bonds to kept within tolerable limits over a longer span.

The ability to form leads with a relatively longer span could be advantageous in a lead frame having a large number of leads. The minimum width of the internal ends of the leads is limited by the thickness of the lead frame material as is also the minimum spacing between the leads. Generally, the stamping rules dictate that the distance between the fingers being pierced out cannot be much less than the thickness of the material. For example, a lead frame having a thickness of 0.010" can tolerate the tips having a minimum width of approximately 0.010" and a minimum spacing between the leads of approximately 0.010". These size factors limit the minimum size of the central periphery defined by the lead tips. The minimum size of the central periphery and the maximum permissible span between the lead tips and the bonding pads on the die define the minimum die dimensions which may be used with a lead frame having a given number of leads and a given thickness. As the size of complex semiconductor devices decreases, the minimum die size required by the limitations on the lead frame geometry and the interconnection span is greater than the minimum geometry required to accommodate the functions on the semiconductor chip. The chip in effect, becomes larger in its overall dimensions than required. Also, there are die designs in which it would be advantageous to interconnect to a position on the die other than around the periphery if only a longer span could be tolerated.

The essentials of interconnection bonding are basically the same as in other types of metallurgical bonding. Through a combination of differential movement of the two elements to be bonded, a metallurgical bond is formed. The bonding parameters may be advantageously influenced by the application of heat and pressure (thermocompression bonding), by a combination of heat and ultrasonic energy (thermosonic bonding) or by substantial input of ultrasonic energy (ultrasonic bonding).

The physical characteristics of the lead frame surface to which an interconnection is to be bonded are established by the functional requirements of the lead frame. These include high strength, solderability and high electrical conductivity. Also, the characteristics of the lead frame may be modified by a clad or plated coating which may be added to the lead frame material. These include materials such as copper or silver plating or cladding. The lead frame itself may be formed of materials such as copper or nickel alloys.

The characteristics of the bonding pads on the semiconductor die are limited to those which may be obtained during the deposition of a single or multiple layers of metallization used in creating the pad. There is a further limitation which limits the maximum unit pressure that can be used in bonding to the die so as to avoid fracture of the underlying brittle silicon die material. It can be appreciated that the optimum physical characteristics of one end of the tape finger (which is bonded to the lead frame) may be quite different from the optimum characteristics of the other end of the TAB finger (which may be bonded to the semiconductor die). The choice of the interfacial material to be used in the tape may be selected so as to avoid the formation of undesirable intermetallics between the tape and the lead frame or between the tape and the bonding pad. For instance, the bonding of copper and copper alloy members to members containing aluminum often result in the formation of copper-aluminum intermetallic compounds. These copper-aluminum intermetallic compounds tend to be brittle and degrade the integrity of the bond between the members. They may also adversely affect the electrical conductivity characteristics of the bonded members. To avoid formation of these intermetallic compounds, semiconductor manufacturers have added a silver plated stripe in the area where the aluminum member, such as a lead wire, is to be bonded to a copper member, such as a lead frame. In lieu of a silver plated stripe, a nickel plated surface has also been used.

U.S. Pat. No. 4,498,121 entitled "Copper Alloys For Suppressing Growth Of Cu-Al Intermetallic Compounds" by Breedis et al. discloses copper alloys which may be bonded to aluminum containing members so as to reduce the formation of undesirable copper-aluminum intermetallic compounds.

Another unique application of transport metal tape is set forth in U.S. patent application Ser. No. 587,411 entitled "Tape Packages" by Sheldon H. Butt. A package for an electronic device is disclosed wherein the lead frame and transport bonding tape are combined. The tape may be arched to serve the dual functions of (1) maintaining contact between a semiconductor device and a housing member and (2) enhancing the heat dissipation from the device.

It is a problem underlying the present invention to provide a tape bonding material for electronic circuit fabrication which are subject to relatively high temperatures, are bondable to both the lead frame as well as a semiconductor chip and are resistant to intermetallic formations.

It is an advantage of the present invention to provide an electronic circuit assembly using a tape bonding material which obviates one or more of the limitations and disadvantages of the described prior arrangements.

It is a further advantage of the present invention to provide an electronic circuit assembly using a tape bonding material which is resistant to the formation of intermetallics.

It is a yet further advantage of the present invention to provide an electronic circuit assembly using a tape bonding material which is a high strength material.

It is still another advantage of the present invention to provide an electronic circuit assembly having a tape bonding material which is suitable for dissipating heat from a semiconductor die to which it is affixed.

Accordingly, there has been provided an electronic circuit assembly comprising a semiconductor die having an aluminum terminal pad on its top surface. A lead frame disposed adjacent the semiconductor die is adapted to be electrically connected to the semiconductor die. An electrical connection device interconnects the terminal pad to the lead frame. The electrical connection device includes a transport tape comprising a first member formed from a nickel containing material and a second member formed from a copper containing material. The first and second members are bonded together. The transport tape is disposed in the electronic circuit assembly with its first member bonded to the aluminum terminal pad and its second member bonded to the lead frame.

In another embodiment of the present invention, the transport tape serves to efficiently dissipate heat from the semiconductor die.

DESCRIPTION OF THE DRAWINGS

The invention and further developments of the invention are now elucidated by means of preferred embodiments shown in the drawings:

FIG. 6 is a schematic representation of a section of tape material having the lead fingers stamped in;

Figure 1:
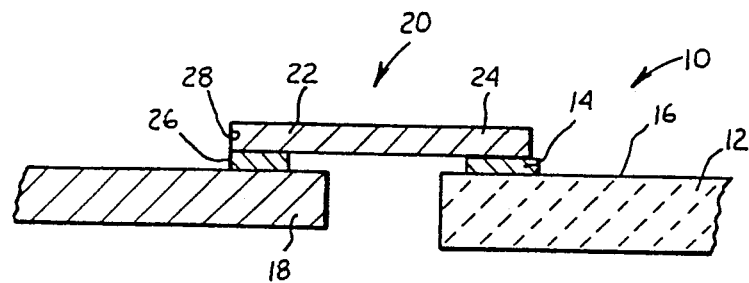
FIG. 1 is a schematic representation of an electronic circuit assembly including a tape bonding material comprising two different components bonded together.

The present invention is particularly directed to an electronic circuit assembly and comprising a semiconductor die 12 having terminal pads 14 on a top surface 16 thereof. A lead frame 18 is disposed adjacent the semiconductor die and is adapted to be electrically connected to the die. The electrical connection means 20 is provided to directly interconnect the terminal pad 14 to the lead frame 18. The electrical connection device comprises a transport tape 22 which may be a biclad or triclad composite as described hereinbelow. The claddings are chosen so that components of the transport tape are strong to resist deformation during material handling, soft to improve the bondability to the lead frame and resistant to the formation of intermetallics between the tape and the semiconductor die.

As can be seen in FIG. 1, the transport tape 22 is disposed in the electronic circuit assembly 10 with one end of member 24 bonded to the terminal pad 14 and a second member 26, clad to member 24, bonded to lead frame 18.

The lead frame material as mentioned hereinabove has a relatively high strength and is accordingly formed of a relatively hard material such as copper-nickel alloys C19400 or C19500. At the same time, it is desirable to provide a soft surface in the area to which the bond to the tape is made. Thick plating or cladding of the lead frame surface in that area to form this soft surface is undesirable because of the inherent cost. Therefore, it may be desirable that the tape area which is bonded to the lead frame be substantially softer than the lead frame material. The transport tape is also bonded at the other end to a bonding pad which is formed of a soft metal or alloy such as aluminum. However, the highest temperature area during the operation of the semiconductor die is on the face of the die. Depending upon the type of service, there may be concern for potential formation of intermetallics between the aluminum on the surface of the die and the material from which the tape is manufactured. This may be of a particular concern with bipolar integrated circuits which generally operate at relatively high temperatures.

FIG. 1 represents a unique system to overcome the problem of providing a soft bonding surface between the transport tape 24 and the lead frame 18 on one side while reducing the potential formation of intermetallics between an aluminum terminal pad 14 and the transport tape on the other side. The tape 22 is manufactured from a binary composite. One component of the composite is a nickel containing material 24 which may consist essentially of up to 100% nickel and the remainder copper; more preferably, 20 to 40% nickel and the remainder copper. The important advantage of using a material containing nickel is that when bonded to aluminum containing elements, there is a significant reduction in the level of copper-aluminum intermetallic compounds. More details of this advantage are described in U.S. patent application Ser. No. 457,605. Also, the material 24 has a yield strength of at least about 60,000 psi. A second component 26 of a material having a yield strength of less than about 40,000 psi enhances the bonding with the lead frame 18. Preferably, the second component 26 is formed of a material consisting essentially of copper. The component 26 may be clad onto the copper-nickel component 24. Then, the tape is etched and the copper removed from the area to which the die 12 is to be bonded. This allows the surface of the tape which is to be presented to the aluminum bump 14 on the die to preferably be a copper nickel surface. At the same time, the surface of the tape presented to the hard lead frame is a soft material such as copper.

In order to provide the component 26 in its softest possible condition, the tape 22 may be annealed at a temperature above the annealing temperature of component 26 and below that of component 24 so that the component 24 remains hard while the component 26 is soft. For instance, the component 26 may be formed of copper or a copper alloy, such as alloy C11000, which may be annealed so that the yield strength is under 40,000 psi while the strength of the copper-nickel component 24 is above about 60,000 psi. Since the copper-nickel portion of the tape remains hard, the tape leads or fingers are relatively resistant to deformation during assembly and make it possible to increase the separation between the tips of the lead frame 18 and the semiconductor die 12. This is of an important advantage in the case of high count lead devices as mentioned above.

Figure 2:
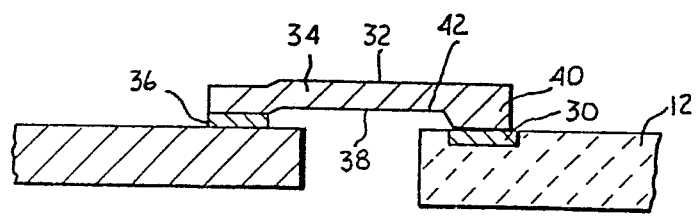
FIG. 2 is a schematic representation of a bumped tape bonding material in accordance with the present invention.

FIG. 2 is essentially the same as FIG. 1 except that the bonding pad 30 on the die 12 is essentially flush with the top surface of the die. This necessitates the use of a bumped tape 32. The tape is again made from a biclad composite preferably comprising a copper-nickel component 34 and a copper component 36. As with the embodiment of FIG. 1, each of these components may be chosen with different compositions as long as their yield strengths and ability to bond to the semiconductor and the lead frame are not impaired. A portion 38 of the element 34 is removed by any desirable method such as etching to leave a bump 40 extending outward from the surface 42 of the tape. Preferably, this bump extends outward from the surface 42 at least 0.001" in order that the tape 32 does not contact the surface of the semiconductor 12. It should be noted that the component 36 of FIG. 2 has a thickness of at least about 0.0001" as does the equivalent component 26 in FIG. 1.

The electrical conductivity of copper-nickel alloys within the range specified above is only in the order of 4 to 8% IACS. To compensate for this poor conductivity, the cross section of tape leads is typically substantially larger than the cross section of gold or aluminum bonding wires. For example, the minimum cross section of the tape leads may be approximately 12 square mils as compared to the cross section of a 0.001" diameter bonding wire which is only 0.79 square mils, a ratio of 15:1. Thus, the current carrying capacity of a copper-nickel tape lead is approximately equal to that of a 0.001" gold bonding wire. However, as the semiconductors become more complex and the dies become smaller, the ability to form smaller tape leads which have adequate current carrying capacity as well as heat dissipation abilities becomes more important.

Figure 3:
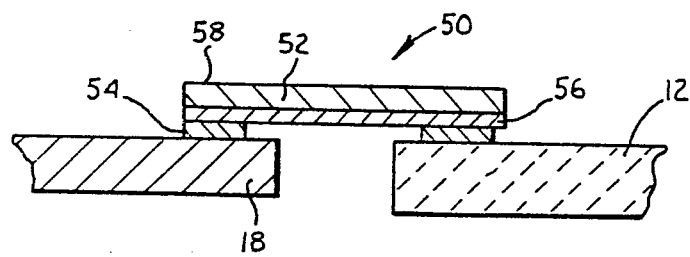
FIG. 3 is a schematic representation of a tape bonding material comprising three different materials clad together.

Referring to FIG. 3, there is shown an alternative embodiment wherein the advantages discussed with respect to the first embodiment shown in FIGS. 1 and 2 are maintained while attaining improved electrical and thermal conductivity at the same time. In this embodiment, the tape 50 is manufactured from a three layer composite. The thickest component 52 is a high conductivity material which is preferably an anneal resistant high conductivity copper alloy, such as, for example, copper alloys C19400 or C15100. The alloy has a high yield strength of a minimum of about 60,000 psi. Also, the alloy has to have an anneal resistance so that it does not anneal at the temperature that the soft component 54 (corresponding to component 26 in FIG. 1) anneals. Also, the component 52 must have a high conductivity which is at least twice that of copper-nickel and, preferably, 50% or more IACS. The intermediate layer 56 of the composite is a copper-nickel alloy which is substantially the same as component 24 described in conjunction with the embodiment of FIG. 1. The outer layer 54 is preferably etched away except on the end portion 58 of the internal lead which is to be bonded to the lead frame 18. As described with regards to the embodiments of FIGS. 1 and 2, the tape 50 may be annealed so as to render the copper area 54 as soft as poss1ble without affecting the remainder of the tape.

Figure 4:
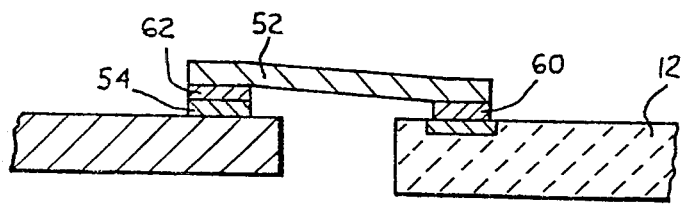
FIG. 4 is a schematic representation of a triclad tape bonding material wherein two of the claddings are only on either end of the metal finger.

Referring to FIG. 4, there is shown an embodiment which is substantially the same as FIG. 3 except that the copper-nickel component has a central portion etched away so that only end pads 60 and 62 of the copper-nickel substrate remain.

Figure 5:
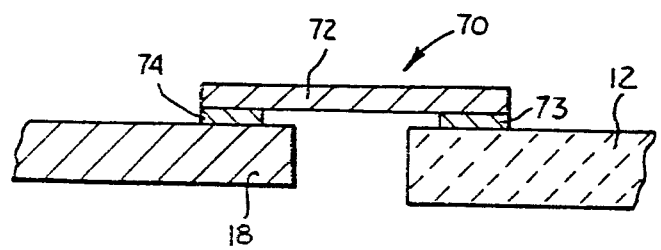
FIG. 5 is a schematic representation of a biclad tape bonding material.

In certain operating environments, the subsequent processing or operating temperature to which the tape-die interface will be exposed will not create the potential formation of copper-aluminum intermetallics at this interface. In that event, the copper-nickel alloy material which is advantageously bonded to the aluminum terminal pad 73 is not required. Then, as shown in FIG. 5, the transfer tape 70 may be formed of a high strength anneal resistant copper alloy 72 which substantially has the same operating characteristics as the copper alloy 52 described with regards to the embodiments of FIGS. 3 and 4. As with the embodiments described hereinabove, a soft metal component 74, substantially the same as component 26 of FIG. 1, is clad to the component 72 to enhance the bonding characteristics between the transfer tape 70 and the lead frame 18.

Figure 6:
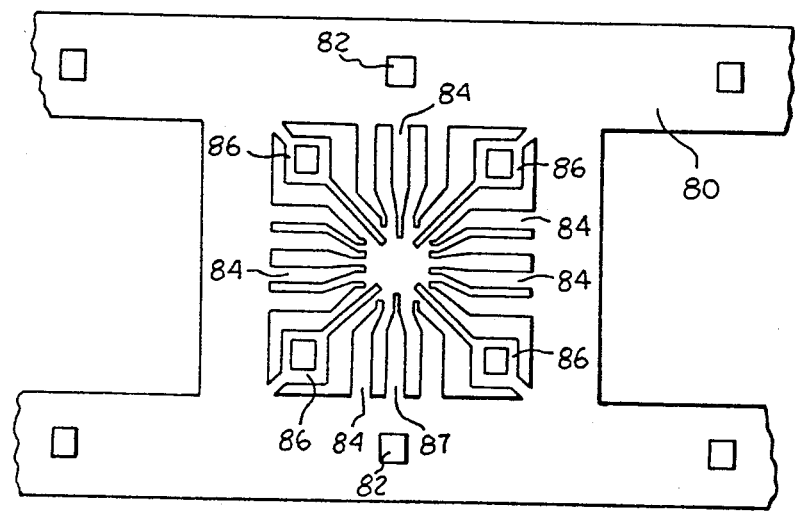

FIG. 6 shows a fragment of metal tape 80 which has been prepared to accommodate a semiconductor device 12. Only one pattern is shown, however, it is understood that a plurality of such patterns exist along the tape. Holes 82 act to index and transport the tape in the following process. A plurality of metal fingers 84, 86 and 87 are configured to mate with the bonding pads on semiconductor device 12. The metal of tape 80 is preferably a composite of the materials as described in the embodiments illustrated in FIGS. 1 through 5. It is preferred that each finger include a raised portion at the end which bonds to the semiconductor. However, it is also within the scope of the present invention to prepare flat tape and provide the terminal bumps on the semiconductor device itself. An important advantage of using the transport tape is that all of the tape fingers 84 may be gang bonded at the same time to the bonding pads of semiconductor device 12. Any number of fingers 84 may be used and configured in any desirable manner. For example, any of the fingers, such as fingers 87 may be a longer length so as to reach any bonding terminal on the die as desired. The four corner fingers 86 are discussed in detail below. If desired, an insulating film composed of, for example, a two-mil thick polyimide (such as Dupont, KAPTON polyimide) may be coated on one or both faces of the tape with an adhesive such as B-staged epoxy. The film is preferably not deposited on the strip sections wherever the leads are to be bonded.

Figure 7:
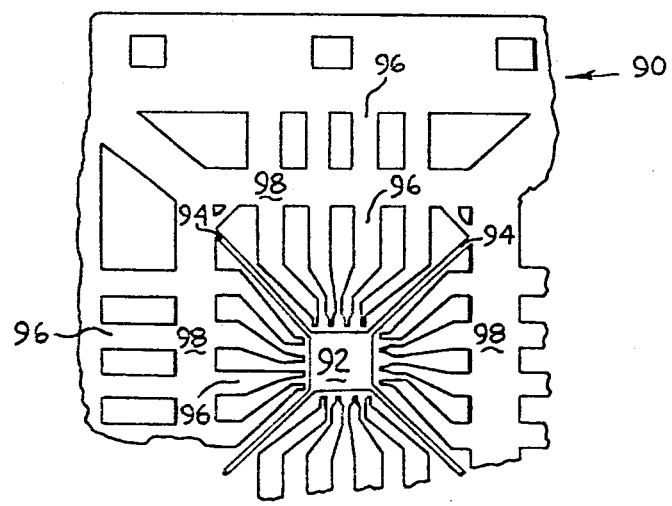
FIG. 7 is a schematic representation of a conventional lead frame.

Referring to FIG. 7, there is shown a section of a typical Quad Pak lead frame 90. The central pad area 92, to which the die 12 is to be attached, is supported at the corners by support bars 94 which are not connected to external leads. Instead, the corner fingers 94 end at the dam bars 98. Once the lead frame with the semiconductor die bonded thereto is placed into a housing and encapsulated with a standard encapsulating material, the lead frame material is trimmed off so that only the fingers 96 are abutting out from the package. However, the corner fingers 94 are on the inner side of the dam bar, closer to the die and, therefore, do not jut out from the package. This feature enables these corner bars to be quite suitable to use as heat dissipation leads as explained below. It should be noted that it is within the terms of the present invention to allow the corner leads to extend from the package if such a configuration were desired.

To optimize heat dissipation from the die, one or more of the tape fingers may be bonded to pads on the die more central than those bonding pads distributed around the periphery. This requires that the unsupported cantilver span to be made by the tape finger, between the lead frame and the die, be quite long as compared to the normal length between the lead frame and the terminal pad near the periphery of the die. In principle, this requires that the tape material have the characteristics of both high strength and high thermal conductivity.

Another solution is to provide an arch in the tape material so that the tape finger does not have a tendency to contact the die except where it is bonded to the terminal. Shaping the fingers after etching is quite impractical. Therefore it is thought that after the application of the photoresist pattern and its development, the unetched tape be formed before the etching process. Then the tape finger can be bonded to the lead frame and the die in the shaped condition.

A manufacturing consideration to be taken into account is that the end of the tape finger which is to be bonded to the terminal pad near the center of the die must be coplanar with those bonded to the peripheral bonding pads. A solution to this problem is to confine the shaping of the finger to the area between the pheripheral terminal pads and the inboard terminal pads.

Figure 8:
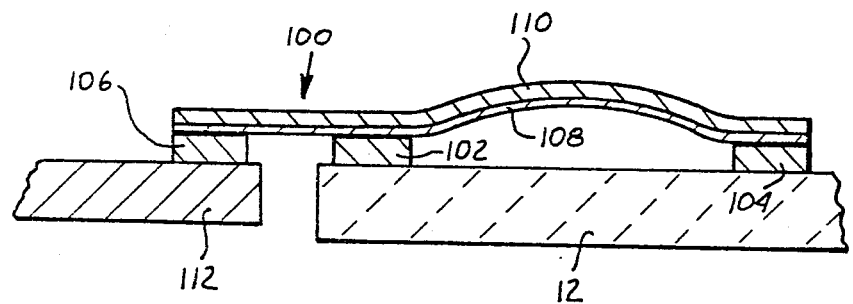
FIG. 8 is a schematic representation of a tape bonding material structure which is suitable for dissipating heat from the surface of a semiconductor die.

Referring to FIG. 8, TAB tape finger 100 is arched away from the die 12 between the terminal pads 102 and 104. This acts to limit the extent of the unsupported span reaching the more centrally located pad 104. At the same time, it allows for improved heat dissipation from the central area of the pad. Using any of the clad tape materials described hereinabove, the tape finger 100 is preferably formed of materials to give it the needed characteristics of high strength, good bondability and substantial elimination of the potential intermetallics. For example, cladding 106 is copper like cladding 26 of FIG. 1. The cladding 108, bonded to the terminal pads, is a copper-nickel material like cladding 22 of FIG. 1. The principal component 110 is a high strength, high conductivity copper alloy like cladding 52 of FIG. 3. The particular shape of the arch between the terminal pads 102 and 104 is a matter of design and can be of any desired configuration. Also, it is within the terms of the present invention to form the arch between the lead frame 112 and the centrally located terminal pad 104 on the die 12 and forego the connection of the finger to the peripheral pad 102 as shown.

As mentioned hereinabove, the support bars 94 of the Quad Pak 90 illustrated in FIG. 7 are not connected to external leads. These support bars are typical of DIP lead frames which use supports for the die pads. It is within the terms of the present invention to improve the heat dissipation from a semiconductor die by bonding one or more of the corner fingers 86 of the transport tape 80 between the surface of the semiconductor chip and the support bars 94 on the lead frame 90. This may be accomplished by bonding the inner ends of the fingers 86 to either a peripheral terminal pad on a chip or to an inboard pad and may further include the provision of an arch as described with regards to the embodiment illustrated in FIG. 8.

Figure 9:
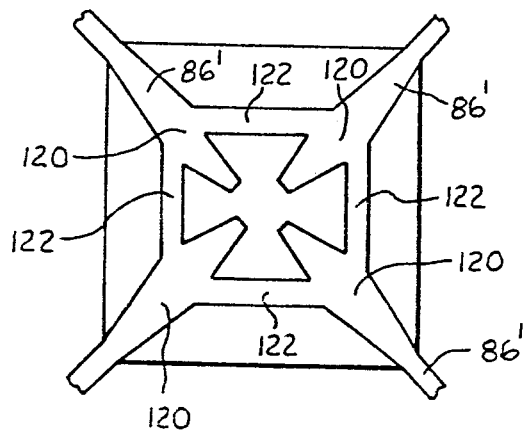
FIG. 9 is a schematic representation of only the thermal dissipation leads of a stamped tape bonding material structure.

Referring to FIG. 9, corner fingers 86' formed of any cladding described above are thermal dissipation leads. It may be desirable to form each of them with an arch, as seen in FIG. 8 and to join the arched portions of each of the thermal leads together near the apex of the arch. Each of the thermal leads 86' may be an extension of the corner leads 86 as shown in FIG. 6. The arched sections 120 of the fingers 86' may be joined by a connecting bar 122. This connecting bar provides an additional advantage in that it strengthens the dissipation leads 86' and helps prevent them from collapsing under the pressure exerted by the molding compound. Further, the thermal dissipation leads may be formed in any configuration and, preferably, wider within the area of the chip as compared to the area external to the chip. The increase in the width of the fingers 86' improves their rigidity and their heat dissipation characteristics. Of course, they are preferably tapered back to a smaller dimension at the point at which they are bonded to the terminal leads on the die so as to minimize the extent of the surface area on the die to be occupied by the terminal bonding pads. Although the configuration of the connecting bars 122, shown in FIG. 9, is substantially square, it is also within the terms of the present invention to form it in any desired shape and between any number of transport tape fingers. It should also be noted that although FIG. 9 only shows the corner fingers attached to the die, any number of other fingers may be attached to terminal pads near the periphery of the die as described hereinabove.

Figure 10:
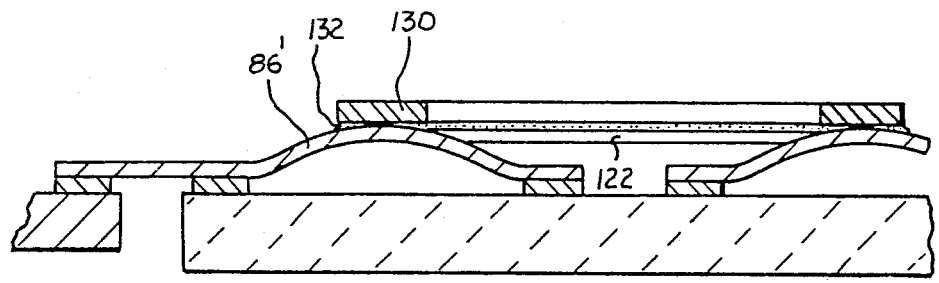
FIG. 10 is a schematic representation of a tape bonding material structure including a heat conduction ring.

The embodiment of FIG. 10 includes ring 130, of conductive material such as copper, attached to the connecting bars 122 of the thermal dissipation leads 86' illustrated in FIG. 9. The ring 130 may be attached to the connection bars by any suitable means such as a conductive adhesive 132 composed of any conventional metal powdered dope epoxy. The shape of the ring 130 could be of any desired configuration such as a donut shape or a hollow square. The ring may act as a supplementary heat sink or heat spreader within the package. If desired, the ring could actually form an outer surface of the final package and thereby be even more effective in dissipating heat.

The combination of the tape fingers joined by the connection bars with or without the ring, could be connected to the lead frame so as to be electrically grounded. In that instance, a Faraday cage would be formed to assist in protecting the die from electromagnetic interference.

Figure 11:
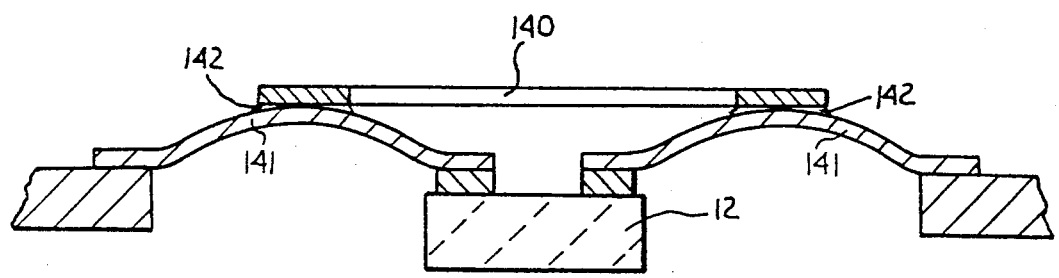
FIG. 11 is a schematic representation of a tape bonding structure including a nonconductive ring for strengthening the metal fingers.

In certain applications, the semiconductor die size is minimized and the span between the lead frame and the periphery of the die is so large that the tape fingers would have a tendency to sag and possibly contact the die and short out the circuit. The use of relatively high strength claddings for the tape finger leads, as described in the embodiments illustrated in FIGS. 1 through 5, would tend to mitigate this problem. Alternatively, or in conjunction with, the leads 141 may be arched between the lead frame and the die as shown in FIG. 11. As described above, the forming of the arch in the lead fingers 141 would preferably occur before the transport tape is etched into the desired configuration. To reinforce the arches, a ring 140 having any desired shape may be bonded to the top of the arches using a nonconductive adhesive 142 such as epoxy. To improve heat dissipation the ring could be made from a conductive material and the adhesive could be thermally but not electrically conductive. It is also within the terms of the present invention to eliminate the ring 140.

The claddings may be formed by any conventional technique such as the POSIT-BOND bonding process described in U.S. Pat. No. 3,381,364.

The patents and article set forth in the specification are intended to be incorporated by reference herein.

It is apparent that there has been provided in accordance with this invention a tape bonding material and structure for electronic circuit fabrication which fully satisfy the objects, means and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A transport tape adapted for electrically interconnecting at least one terminal pad on a semiconductor die to at least one of a plurality of leads;
   said transport tape comprising:
   a plurality of interconnect tape fingers, at least tape fingers adapted to be bonded at a first end to said terminal pad and further adapted to be bonded at a second end to one of said plurality of leads;
   said transport tape further comprising:
   a first layer of about 20 to about 40% nickel and the remainder copper, and having a yield strength of at least about 60,000 psi, said first layer for reducing the formation of intermetallics and being adapted for bonding to said terminal pad;
   a second layer formed from a copper containing material having a yield strength less than about 40,000 psi, said second layer being a softer material than said first layer and adapted to be bonded to one of said plurality of leads;
   a third layer formed of a copper alloy having a yield strength of at least 60,000 psi and a conductivity of at least about 50% IACS;

said second and third layers being in direct contact with opposing sides of said first layer and bonded thereto.

2. The transport tape of claim 1 including said second layer being copper.

3. The transport tape of claim 1 further including:
a semiconductor die having at least one terminal pad thereon;
a lead frame having a plurality of leads; and
at least one of said tape fingers having the first end of said first layer bonded to said terminal pad and the second end of said second layer bonded to one of said plurality of leads.

4. A transport tape adapted for electrically interconnecting at least first and second terminal pads on a semiconductor die to at least one of a plurality of leads,
said transport tape comprising:
a plurality of interconnected tape fingers, at least one of said tape fingers having a first end section adapted to be bonded at either end of said end section to said first and second terminal pads, said first end section being shaped into an arch between the ends of said end section, said arch adapted to minimize the tendency of the tape to sag and contact said die, said at least one of said tape fingers further having a second end section adapted to be bonded to one of said plurality of leads,
said transport tape further comprising:
a first layer formed of a copper containing material having a yield strength of at least about 60,000 psi and a conductivity of at least about 50% IACS, and
a second layer formed from a nickel containing material, said second layer being in direct contact with and bonded to said first layer and further adapted for connection to said first and second terminal pads on said semiconductor die.

5. The transport tape of claim 4 further comprising a third layer formed from a copper containing material, said third layer being in direct contact with and bonded to said second layer, said third layer further being adapted to be connected to said lead frame.

6. The transport tape of claim 5 including said third layer having a yield strength of less than about 40,000 psi.

7. The transport tape of claim 6 including said third layer being copper.

8. The transport tape of claim 7 including said second layer being up to 100% nickel and the remainder copper.

9. The transport tape of claim 5 further including:
a semiconductor die having at least first and second terminal pads thereon;
a lead frame having a plurality of leads; and
at least one of said tape fingers having a first end section bonded at either end of said first end section to said first and second terminal pads and a second end section bonded to one of said plurality of leads.

10. The transport tape of claim 4 including at least a second tape finger having substantially the same structure as said first tape finger; and
connection bar means connecting said first and second tape fingers adapted to enhance the heat dissipation from said semiconductor die.

11. The transport tape of claim 9 wherein said connection bar means further includes a ring means affixed to at least said first and second tape fingers for strengthening said first and second tape fingers and for improving the heat transfer therefrom.

12. The transport tape of claim 10 further including a conductive bonding means disposed between and bonded to said first and second tape fingers and said ring means.

13. A sag resistant tape having a plurality of metal fingers each adapted for electrically interconnecting at least one terminal pad on a semiconductor die to one of a plurality of external leads;
said tape comprising:
a clad material formed of a softer metal or alloy layer, a first high strength alloy layer and a second high strength alloy layer, said softer layer and said second high strength alloy layer, bonded onto opposing sides of said first high strength alloy layer;
said first high strength layer comprising a copper alloy having a yield strength of at least about 60,000 psi for resisting sag in the tape;
said second high strength layer having a yield strength of at least about 60,000 psi and a conductivity of at least about 50% IACS; and
said softer layer being a metal or alloy having a yield strength substantially less than said high strength layers.

14. The sag resistant tape of claim 13 wherein said softer layer has a yield strength of less than about 40,000 psi.

15. A sag resistant tape having a plurality of metal fingers each adapted for electrically interconnecting at least one terminal pad on a semiconductor die to a plurality of external leads, said tape comprising:
a clad material formed of a high strength alloy layer and a softer metal or alloy layer;
said high strength layer comprising a copper alloy having a yield strength of at least about 60,000 psi for resisting sag in the tape, said high strength layer having a conductivity of at least about 50% IACS; and
said softer layer being a metal or alloy having a yield strength substantially less than said high strength layer, said softer layer having a yield strength of less than about 40,000 psi.

16. The sag resistant tape of claim 15 further including an alloy layer disposed between said bonded to said high strength alloy layer and to said softer layer for reducing the formation of intermetallics and being adapted for bonding to said terminal pad.

17. The sag resistant tape of claim 16 wherein said alloy layer for reducing intermetallics comprises about 20 to about 30% nickel and the remainder copper.

* * * * *